US010050588B2

(12) United States Patent
de Jong et al.

(10) Patent No.: US 10,050,588 B2
(45) Date of Patent: Aug. 14, 2018

(54) DOHERTY AMPLIFIER CIRCUITS

(71) Applicant: NXP B.V., Eindhoven (NL)

(72) Inventors: Gerben Willem de Jong, Veldhoven (NL); Mark Pieter van der Heijden, Eindhoven (NL); Jozef Reinerus Maria Bergervoet, Eindhoven (NL); Tony Vanhoucke, Bierbeek (BE); Gian Hoogzaad, Mook (NL); Ivan Matkov Zahariev, Nijmegen (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/596,416

(22) Filed: May 16, 2017

(65) Prior Publication Data

US 2018/0006611 A1   Jan. 4, 2018

(30) Foreign Application Priority Data

Jun. 30, 2016   (EP) ..................... 16177387

(51) Int. Cl.
  *H03F 3/68*   (2006.01)
  *H03F 1/02*   (2006.01)
  (Continued)

(52) U.S. Cl.
  CPC ............. *H03F 1/0288* (2013.01); *H03F 1/56* (2013.01); *H03F 3/213* (2013.01);
  (Continued)

(58) Field of Classification Search
  CPC ............. H03F 1/0288; H03F 1/07; H03F 3/68
  (Continued)

(56) References Cited

U.S. PATENT DOCUMENTS 7,078,976 B2 *   7/2006   Blednov ................. H01L 24/49
                                                                330/124 R
7,800,448 B2      9/2010   Blednov
                  (Continued)

FOREIGN PATENT DOCUMENTS

EP        2 621 085 A2      7/2013
WO   WO-2006/123289 A2    11/2006

OTHER PUBLICATIONS

European Patent Application No. 16177369.2 filed Jun. 30, 2016, 28 pages.

*Primary Examiner* — Steven J Mottola

(57) ABSTRACT

A Doherty amplifier circuit comprising: a splitter having: a splitter-input-terminal for receiving an input signal; a main-splitter-output-terminal; and a peaking-splitter-output-terminal; a main-power-amplifier having a main-power-input-terminal and a main-power-output-terminal, wherein; the main-power-input-terminal is connected to the main-splitter-output-terminal; and the main-power-output-terminal is configured to provide a main-power-amplifier-output-signal; a peaking-power-amplifier having a peaking-power-input-terminal and a peaking-power-output-terminal, wherein: the peaking-power-input-terminal is connected to the peaking-splitter-output-terminal; and the peaking-power-output-terminal is configured to provide a peaking-power-amplifier-output-signal. The splitter, the main-power-amplifier and the peaking-power-amplifier are provided by means of an integrated circuit.

16 Claims, 5 Drawing Sheets

(51) Int. Cl.
*H03F 1/56* (2006.01)
*H03F 3/213* (2006.01)

(52) U.S. Cl.
CPC .. *H03F 2200/318* (2013.01); *H03F 2200/387* (2013.01); *H03F 2200/534* (2013.01); *H03F 2200/541* (2013.01)

(58) Field of Classification Search
USPC .......................................................... 330/295
See application file for complete search history.

(56) References Cited

U.S. PATENT DOCUMENTS

| | | | |
|---|---|---|---|
| 8,228,123 B2 | 7/2012 | Blednov | |
| 2004/0085134 A1* | 5/2004 | Griffith | H03F 1/0288 330/295 |
| 2006/0257149 A1 | 11/2006 | Hirth et al. | |
| 2014/0145791 A1* | 5/2014 | Svechtarov | H03F 1/0288 330/295 |
| 2014/0155003 A1 | 6/2014 | Nakatani | |
| 2016/0028351 A1 | 1/2016 | Jin et al. | |

* cited by examiner

DOHERTY AMPLIFIER CIRCUITS

CROSS-REFERENCE TO RELATED APPLICATIONS

This application claims the priority under 35 U.S.C. § 119 of European patent application no. 16177387.4, filed Jun. 30, 2016 the contents of which are incorporated by reference herein.

The present disclosure relates to Doherty amplifier circuits, and in particular to Doherty amplifier circuits that can, at least in part, be implemented as an integrated circuit.

According to a first aspect of the present disclosure there is provided A Doherty amplifier circuit comprising:
  a splitter having:
    a splitter-input-terminal for receiving an input signal;
    a main-splitter-output-terminal; and
    a peaking-splitter-output-terminal;
  a main-power-amplifier having a main-power-input-terminal and a main-power-output-terminal, wherein:
    the main-power-input-terminal is connected to the main-splitter-output-terminal; and
    the main-power-output-terminal is configured to provide a main-power-amplifier-output-signal;
  a peaking-power-amplifier having a peaking-power-input-terminal and a peaking-power-output-terminal, wherein:
    the peaking-power-input-terminal is connected to the peaking-splitter-output-terminal; and
    the peaking-power-output-terminal is configured to provide a peaking-power-amplifier-output-signal;
  an integrated circuit;
  wherein the splitter, the main-power-amplifier and the peaking-power-amplifier are provided by means of the integrated circuit.

In one or more embodiments the splitter-input-terminal is connected to the main-splitter-output-terminal. The splitter may comprises a splitter-attenuator and a splitter-phase-shifter connected in cascade between the splitter-input-terminal and the peaking-splitter-output-terminal.

In one or more embodiments the splitter-attenuator and the splitter-phase-shifter are provided on the integrated circuit.

In one or more embodiments the splitter-attenuator comprises a variable splitter-attenuator that is configurable to apply a variable attenuation or amplification factor to the input signal.

In one or more embodiments the variable splitter-attenuator comprises: a first-variable-resistor; and a second-variable-resistor. The second-variable-resistor may be connected between an attenuator-input-terminal and an attenuator-output-terminal. The first-variable-resistor may be connected between the attenuator-input-terminal and a reference-terminal.

In one or more embodiments the splitter-phase-shifter comprises a variable splitter-phase-shifter that is configurable to apply a variable phase shift to the input signal.

In one or more embodiments the variable splitter-phase-shifter comprises: a first-variable-capacitor, a first-inductor, a second-variable-capacitor, a third-variable-capacitor, a second-inductor, and a fourth-variable-capacitor. The first-variable-capacitor may be connected between a phase-shifter-input-terminal and a reference-terminal. The first-inductor may be connected between the phase-shifter-input-terminal and an intermediate-node. The second-variable-capacitor may be connected between the intermediate-node and the reference-terminal. The third-variable-capacitor may be connected between the intermediate-node and the reference-terminal. The second-inductor may be connected between the intermediate-node and a phase-shifter-output-terminal. The fourth-variable-capacitor may be connected between the phase-shifter-output-terminal and the reference-terminal.

In one or more embodiments the Doherty amplifier further comprises a controller that is configured to:
  receive one or more sensed-temperature-signals; and
  set control parameters of the variable splitter-attenuator and/or the variable splitter-phase-shifter based on the sensed-temperature-signals.

In one or more embodiments the sensed-temperature-signals are representative of: a temperature of the integrated circuit, or a temperature of the main-power-amplifier or the peaking-power-amplifier.

In one or more embodiments the Doherty amplifier further comprises: a transformer having a transformer-input-terminal and a transformer-output-terminal. The transformer-input-terminal may be connected to the peaking-power-output-terminal. The transformer-output-terminal may be configured to provide a transformer-output-signal to a combining node.

In one or more embodiments the transformer is provided on the integrated circuit.

In one or more embodiments the Doherty amplifier circuit further comprises:
  a package; and
  a laminate;
  wherein the integrated circuit and the laminate are provided in the package.

In one or more embodiments the Doherty amplifier circuit further comprises a main-output-impedance-inverter connected between the main-power-output-terminal and a combining node. The main-output-impedance-inverter may comprise a CLC-inductor, a first-CLC-capacitor and a second-CLC-capacitor. The CLC-inductor may be connected between the main-power-output-terminal and the combining node. The first-CLC-capacitor may be connected between the main-power-output-terminal and a reference terminal. The second-CLC-capacitor may be connected between the combining node and the reference terminal.

In one or more embodiments the first-CLC-capacitor may be provided on the integrated circuit. The CLC-inductor and the second-CLC-capacitor may be provided on the laminate.

In one or more embodiments the integrated circuit comprises a BiCMOS circuit.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

BRIEF DESCRIPTION OF DRAWINGS

One or more embodiments will now be described by way of example only with reference to the accompanying drawings in which:

FIG. 1 shows an example embodiment of a Doherty amplifier circuit 100. The Doherty amplifier 100 has a Doherty-input-terminal 102 and a Doherty-output-terminal 104. Amongst other things, a splitter 106, a main-power-amplifier 112 and a peaking-power-amplifier 114 are connected between the Doherty-input-terminal 102 and the Doherty-output-terminal 104. As will be discussed in detail below, advantageously, each of these components 106, 112, 114 is provided by means of an integrated circuit 126.

Figure 1:
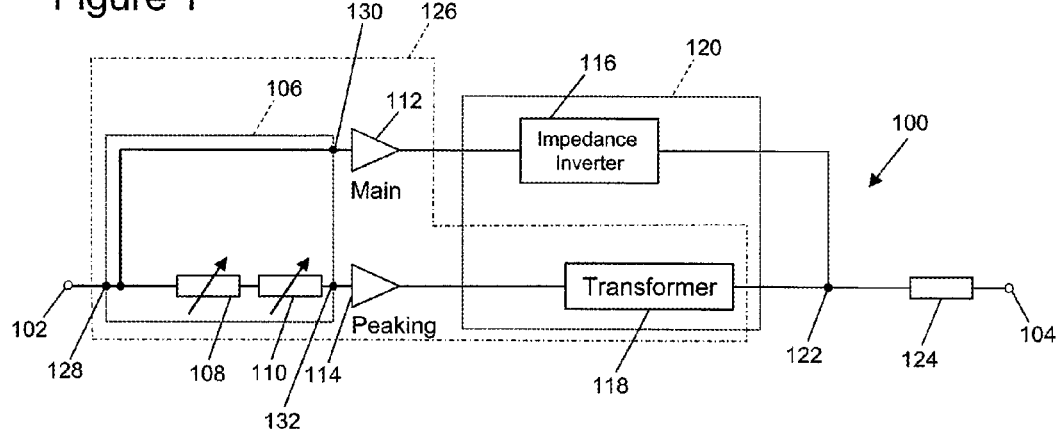
FIG. 1 shows an example embodiment of a Doherty amplifier circuit.

Some of the components of the Doherty amplifier circuit 100 are implemented on an integrated circuit (IC) 126, and some of the components are implemented on a laminate. This can result in a compact solution. The laminate and the IC 126 can together be considered as part of the same Doherty amplifier device. Therefore, the components of the Doherty amplifier circuit 100 can be partitioned between the IC 126 and a laminate-based PA module (such as a dual-layer laminate). Partitioning the design between the chip and the laminate can be a cost effective implementation, for example in terms of package size and surface mounted devices (SMD) component count.

The Doherty amplifier circuit 100 has a main path and a peaking path, connected in parallel with each other between the Doherty-input-terminal 102 and a combining node 122. The combining node 122 is connected to the Doherty-output-terminal 104 through a matching network 124.

The splitter 106 has a splitter-input-terminal 128, a main-splitter-output-terminal 130 and a peaking-splitter-output-terminal 132. The splitter-input-terminal 126 is connected to the Doherty-input-terminal 102 in order to receive an input signal. The splitter-input-terminal 126 is also connected directly to the main-splitter-output-terminal 130. In this way, the input signal received at the Doherty-input-terminal is provided directly to the main-splitter-output-terminal 130, without any significant transformation or processing.

The splitter 106 includes a splitter-attenuator 108 and a splitter-phase shifter 110 connected in cascade between the splitter-input-terminal 128 and the peaking-splitter-output-terminal 132. The splitter-attenuator 108 and the splitter-phase shifter 110 in this example are variable components, which can be set such that together they apply an attenuation and phase shift to the received input signal before it is provided to the peaking-splitter-output-terminal 132. It will be appreciated that the splitter-attenuator 108 and the splitter-phase shifter 110 may be connected between the splitter-input-terminal 128 and the peaking-splitter-output-terminal 132 in the reverse order to that shown in FIG. 1, whilst still providing the required functionality.

The main-power-amplifier 112 has a main-power-input-terminal and a main-power-output-terminal. The main-power-input-terminal is connected to the main-splitter-output-terminal 130. The main-power-output-terminal provides a main-power-amplifier-output-signal, which in this example is an amplified version of the input signal received at the Doherty-input-terminal 102. Only signals that are larger than a certain threshold level may be amplified by the peaking-power-amplifier 114.

The peaking-power-amplifier 114 has a peaking-power-input-terminal and a peaking-power-output-terminal. The peaking-power-input-terminal is connected to the peaking-splitter-output-terminal 132. The peaking-power-output-terminal provides a peaking-power-amplifier-output-signal, which in this example is an amplified version of the phase-shifted and attenuated input signal received at the Doherty-input-terminal 102.

As indicated above, the splitter 106, the main-power-amplifier 112 and the peaking-power-amplifier 114 are provided on the IC 126. This can be considered as monolithically integrating the components. This beneficially enable a physically small and compact circuit to be provided. Also advantageously, the properties of the splitter 106 can be tailored to the downstream components of the Doherty amplifier 100. For example, the splitter 106 does not have to be implemented for a worst case scenario of the downstream components such as the main- and peaking-power-amplifiers 112, 114 (power trains) and a Doherty combiner 120. Therefore, the Doherty amplifier circuit 100 as a whole can be considered more efficient and smaller. Further still, by integrating the splitter 106 and power-amplifiers 112, 114 on the integrated circuit 126, a fixed relative position between these components will be known to the circuit designer. Therefore, their expected interaction with each other can be more accurately modelled and the Doherty amplifier circuit 100 can be particularly efficient. This may not be achievable if the splitter 106 and power-amplifiers 112, 114 were not integrated because their relative positions would not be definitively known, nor would they necessarily be fixed. A yet further advantage is that the splitter 106 and the power-amplifiers 112, 114 can both make use of internal circuits that are available on the IC 126, such as power supply circuits. Therefore, the need for an external power regulator to provide a stable voltage supply for one or more of the splitter 106 and the power-amplifiers 112, 114 can be reduced or avoided.

Also, as will be discussed in more detail below, by implementing the splitter 106 and the power-amplifiers 112, 114 on the integrated circuit 126, better temperature control can be achieved, and better calibration, even self-calibration, of the Doherty amplifier circuit 100 can be achieved. A further advantage of monolithic integration is a good matching of the splitter 106 and the power amplifiers 112 and 114. Furthermore, splitter integration can provide the possibility for reduction of the spread on main parameters over process by the choice of optimal input amplitude and phase settings via a SPI (serial peripheral interface) or an OTP (one-time programmable) memory cell.

In some applications, the integrated circuit can be implemented with BiCMOS technology. In some other technologies, it may not be possible to implement the components of the splitter 106 and the power-amplifiers 112, 114 on the same IC 126.

In this example, the Doherty amplifier circuit 100 includes a transformer 118 in the peaking path. The transformer 118 may also be referred to as a peaking transformer. The transformer 118 is used to perform impedance transformation, and can advantageously enable wideband amplifier operation. This can be achieved because the transformer 118 can have low losses and/or a low leakage inductance.

The transformer 118 has a transformer-input-terminal and a transformer-output-terminal. The transformer-input-terminal is connected to the peaking-power-output-terminal of the peaking-power-amplifier 114. The transformer-output-terminal provides a transformer-output-signal to the combining node 122. The transformer 118 in this example comprises two magnetically coupled inductors, and can be implemented as: (i) an autotransformer with two sub-windings; or (ii) a standard (real) transformer with a primary winding and a secondary winding.

In examples where an autotransformer is used, it may comprise a first-end-terminal, a second-end-terminal and an intermediate-terminal. The first-end-terminal may be galvanically connected to the combining node 122. The intermediate-terminal may be galvanically connected to the peaking-power-output-terminal. The second-end-terminal may be connected to a reference terminal (not shown).

In examples where a standard (real) transformer is used, a first-winding may be galvanically connected between the peaking-power-output-terminal and a reference terminal. A second-winding may be galvanically connected between the combining node 122 and the reference terminal.

In this implementation, the transformer 118 is also provided on the integrated circuit 126. In other implementations, the transformer 118 can be provided on the laminate (not shown).

A main-output-impedance-inverter 116 is connected between the main-power-output-terminal of the main-power-amplifier 112 and the combining node 122. The main-output-impedance-inverter 116 provides an impedance inversion and a 90 degrees phase shift.

In this example, the main-output-impedance-inverter 116 is provided on the laminate and not on the IC 126. However, as will be discussed below, one or more sub-components of the main-output-impedance-inverter 116 can be provided on the IC 126 in other examples.

The splitter-attenuator 108 and the splitter-phase shifter 110, which in this case are placed in front of the peaking-power-amplifier 114, are used such that the signals that arrive at the combining node 122 from the main path and the peaking path are in phase with each other. Therefore, in FIG. 1, there is no need to compensate for an additional 90 degrees in the peaking path, downstream of the peaking-power-amplifier, as may be the case for other Doherty amplifier circuits.

In other cases, the splitter-attenuator 108 and the splitter-phase shifter 110 may be placed in front of the main-power-amplifier 112; or the splitter-attenuator 108 and the splitter-phase shifter 110 can be placed in front of both the main- and peaking-power-amplifier 112, 114.

In some examples, the splitter-attenuator 108 can apply an attenuation-factor or an amplification factor that is between 0 and 1 such that it amplifies a received signal. In such examples, the splitter-attenuator 108 can be referred to as a splitter-amplifier.

The main-output-impedance-inverter 116 and the transformer 118 can be considered together as a wide-band Doherty combiner 120.

Figure 2:
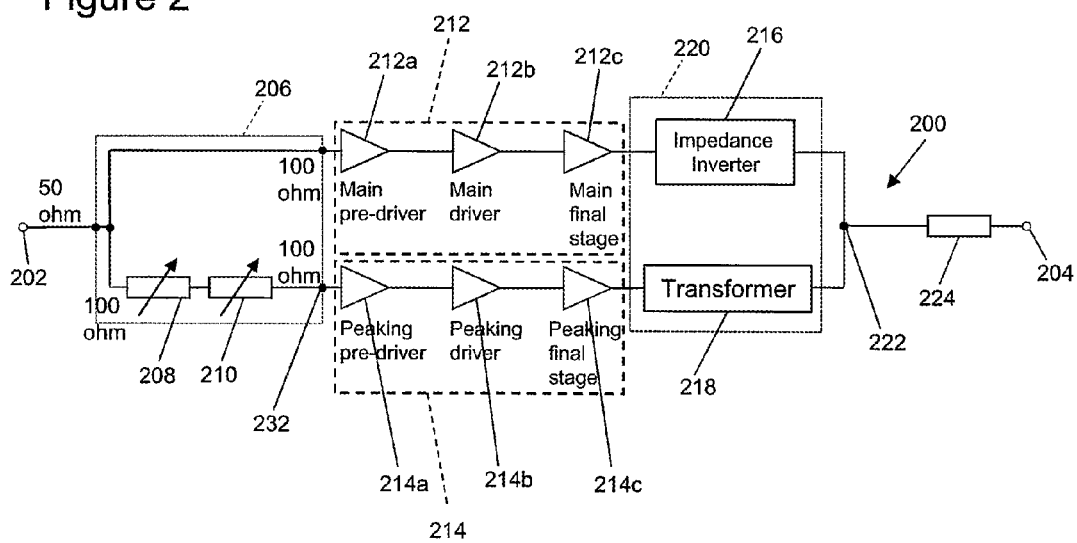
FIG. 2 shows another example embodiment of a Doherty amplifier circuit.

FIG. 2 shows another example embodiment of a Doherty amplifier circuit 200, which is shown as a block diagram of a possible Doherty-amplifier line-up. Components that are also illustrated in FIG. 1 have been given corresponding reference numbers in the 200 series, and will not necessarily be described again here.

The impedance levels shown are the real parallel-equivalent parts of input- or load impedances (impedances seen when looking to the right).

Both the main branch (at the top) and the peaking branch (at the bottom) contain three amplifier stages. That is, the main-power-amplifier 212 includes, from left to right: a main-pre-driver 212a, a main-driver 212b, and a main-final-stage (or main-output-stage) 212c. Similarly, the peaking-power-amplifier 214 includes: a peaking-pre-driver 214a, a peaking-driver 214b, and a peaking-final-stage (or peaking-output-stage) 214c.

An input splitter 206 is shown, with which the amount of attenuation and phase shift in the peaking branch can be controlled by the user in order to improve or optimize the overall linearity of the Doherty amplifier. The default phase shift introduced by the splitter-phase shifter 210 (which is in front of the peaking-power-amplifier chain 214) is around 90 degrees, which cancels with the 90 degrees phase shift introduced by the main-output-impedance-inverter 216 following the main-power-amplifier chain 212. In this way, constructive signal addition is achieved at the combining node 222.

The power of the input signal received at the Doherty-input-terminal (input power) is split into two equal parts in this example because both the main- and the peaking-power-amplifier chains 212, 214 have a 100Ω input resistance. Therefore the overall input resistance is (100//100)=50Ω. At the right-hand side we encounter the output combiner 220, followed by a common output-matching network 224. In this example, the common output-matching network 224 is meant for a 50-Ω load.

The main-output-impedance-inverter 216 in this example is implemented as a CLC circuit (not shown). The CLC circuit includes a CLC-inductor, a first-CLC-capacitor and a second-CLC-capacitor. The CLC-inductor may be connected between the main-power-output-terminal of the main-power-amplifier 212 and the combining node 222. The first-CLC-capacitor may be connected between the main-power-output-terminal and a reference terminal. The second-CLC-capacitor may be connected between the combining node 222 and the reference terminal. The first-CLC-capacitor in this example is provided on the IC. The CLC-inductor and the second-CLC-capacitor are provided on the laminate in this example. In this way, the main branch of the output combiner 220 contains a mostly off-chip on-laminate lumped CLC impedance inverter (as opposed to a quarter-wavelength transmission line), in order to save area.

As discussed above, the peaking branch of the output combiner 220 contains an on-chip output transformer 218. In some examples, the entire output combiner 220 can be implemented on the laminate.

Figure 3:
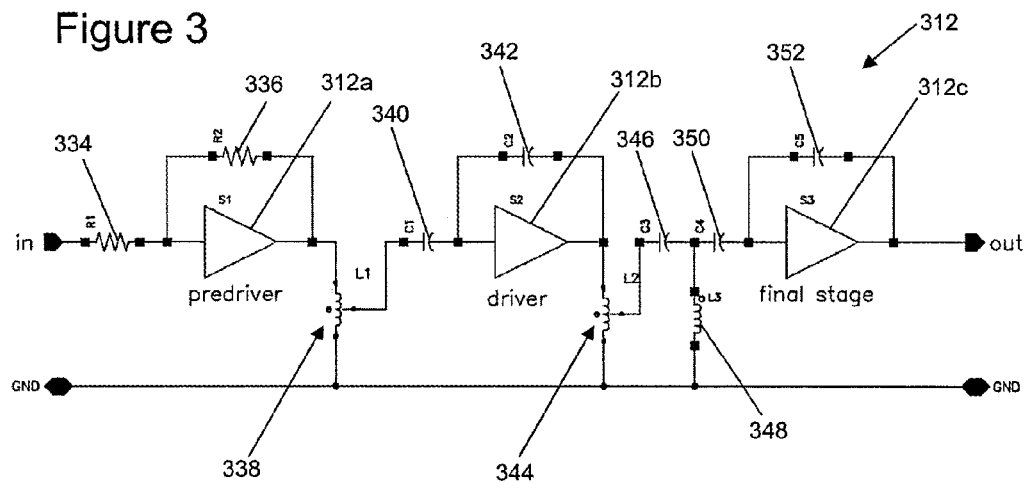
FIG. 3 shows an example implementation of a main-power-amplifier or a peaking-power-amplifier.

FIG. 3 shows an example implementation of a power-amplifier 312, which can be used as the main-power-amplifier or the peaking-power-amplifier of FIG. 2. For example, the main- and peaking-power-amplifier chains can have the same 3-stage topology as shown in FIG. 3, but they may be dimensioned differently. The impedance levels within the main-power-amplifier chain in one example are roughly a factor $[(1-a)/a]=5/3$ higher with respect to those within the peaking amplifier chain. Here parameter a equals ⅜ which corresponds to a back-off level of 8.5 dB, which can be suitable for amplification of signals having a peak-to-average-power ratio (PAPR) of around 8 dB.

The input resistance of the amplifier chain 312 is approximately equal to the resistance of resistor R1 334, since the input stage of the pre-driver 312a acts as virtual ground in good approximation due to parallel feedback via resistor R2 336. The resistor ratio −R2/R1 defines the voltage gain of the pre-driver 312a, assuming high loop-gain.

The inter-stage matching network between the pre-driver 312a and the driver 312b consists out of an autotransformer L1 338 and a series matching capacitor C1 340. The autotransformer L1 338 can halve the output voltage swing of the pre-driver 312a, but can double its current drive capability. In other words, it can perform a factor of 4 impedance down transformation. The series matching capacitor C1 340 can convert the signal voltage into a signal current (trans-admittance jωC1) which drives the driver stage 312b. In this way it can perform current steering, which is beneficial for the linearity of the driver 312b.

The driver 312b converts this input current into an output voltage according to trans-impedance −1/(jωC2). Hence the voltage gain around the driver 312b equals −C1/C2 in good approximation. Since the driver 312b should clip before the pre-driver 312a clips in case of increasing signal amplitude, (C1/C2) can be set such that it is greater than 2. Parasitic collector-base capacitance of the driver 312b is the dominant contribution to C2 342. Capacitive loading on the output of pre-driver stage 312a S1, due to C1 340 and parasitics, can be tuned out by the magnetization inductance of autotransformer L1 338. A detailed description of the inter-stage matching between the pre-driver 312a and the driver 312b will be provided below under the heading "Driver: Inter-stage matching between pre-driver and driver".

The inter-stage matching network between the driver 312b and the final stage 312c consists out of an autotransformer L2 344, a DC-blocking capacitor C3 346, a matching coil L3 348, and a series matching capacitor C4 350. The autotransformer L2 344 can halve the output voltage swing of the driver 312b but can double its current drive capability. In other words, it can perform a factor of 4 impedance down transformation. The DC-blocking capacitor C3 346 can serve as a DC block and at the same time it can tune out the leakage inductance of the autotransformer L2 344. The series matching capacitor C4 350 can convert the signal voltage into a signal current (trans-admittance jωC4), which drives the final stage 312c. In this way it can perform current steering, which is beneficial for the linearity of the final stage 312c. The final stage 312c converts this input current into an output voltage according to trans-impedance −1/(jωC5). Hence, the voltage gain around the final stage 312c equals −C4/C5 in good approximation. Since the final stage 312c should clip before the driver 312b clips in case of increasing signal amplitude, (C4/C5) can be set such that it is greater than 2. Parasitic collector-base capacitance of the final stage 312c is the dominant contribution to C5 352. Capacitive loading on the output of the driver stage 312b S2, due to the series matching capacitor C4 350, can be tuned out by the inductance of matching coil L3 348. Additional capacitive loading on the output of driver stage 312b S2, due to its own output capacitance and other parasitics, can be tuned out by the magnetization inductance of autotransformer L2 344.

According to the above discussion, the total voltage gain of the 3-stage amplifier chain 312 can be written as:

$$G_v = -\frac{1}{4} \cdot \frac{R_2}{R_1} \cdot \frac{C_1}{C_2} \cdot \frac{C_4}{C_5} \quad (1)$$

according to an assumption of high loop gain. Therefore the total power gain can be written as:

$$G_p = \frac{R_1}{R_L} G_v^2 \quad (2)$$

where $R_L$ represents the parallel-equivalent resistive part of the load impedance.

PA Driver Design

Figure 4:
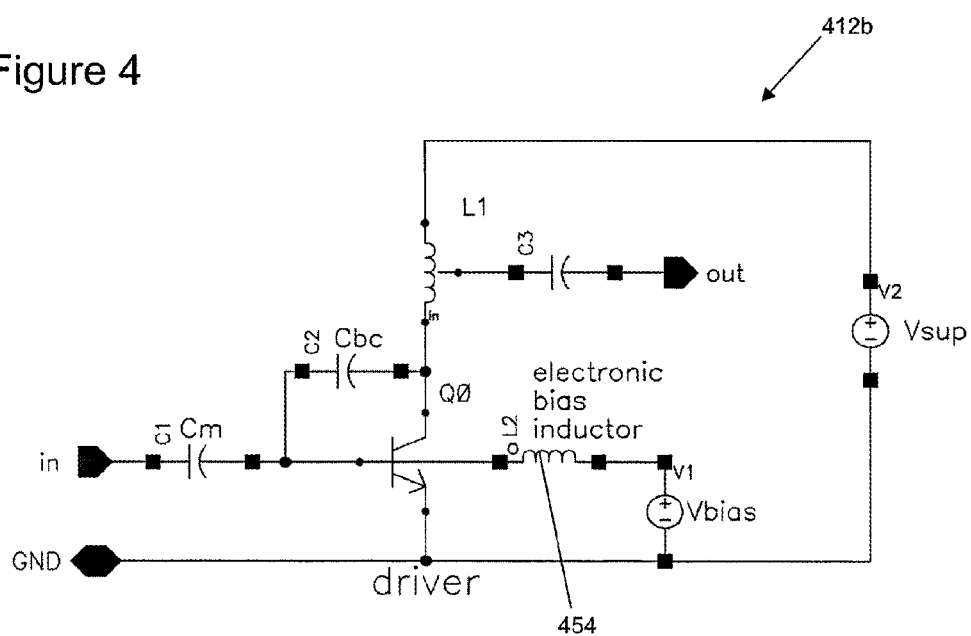
FIG. 4 shows a simplified schematic of a driver that can be used in FIG. 3.

FIG. 4 shows a simplified schematic of a driver 412b that can be used in FIG. 3.

The voltage gain of the driver 412b is mainly determined by the capacitance ratio −Cm/Cbc. The circuit is biased via an electronic inductor 454, as will be discussed below under the heading "Driver: Biasing". Advantageously, the use of electronic inductors can reduce cost and assist in miniaturisation, when compared with passive inductors.

Driver: Dimensioning of the Signal Transistors

Simulations show that the power gain of an output stage, taking into account the losses of an inter-stage-matching network, amounts to approximately 13 dB at full power. If we want to have the driver around 4 dB backed-off with respect to the output stage, such that the overall distortion will be dominated by the output stage and not by the driver, then the driver should be scaled down with respect to the output stage by not more than (13−4)=9 dB. This corresponds to a scaling-down factor of not more than $10^{(9/10)}$=8.

Driver: Biasing

Figure 5:
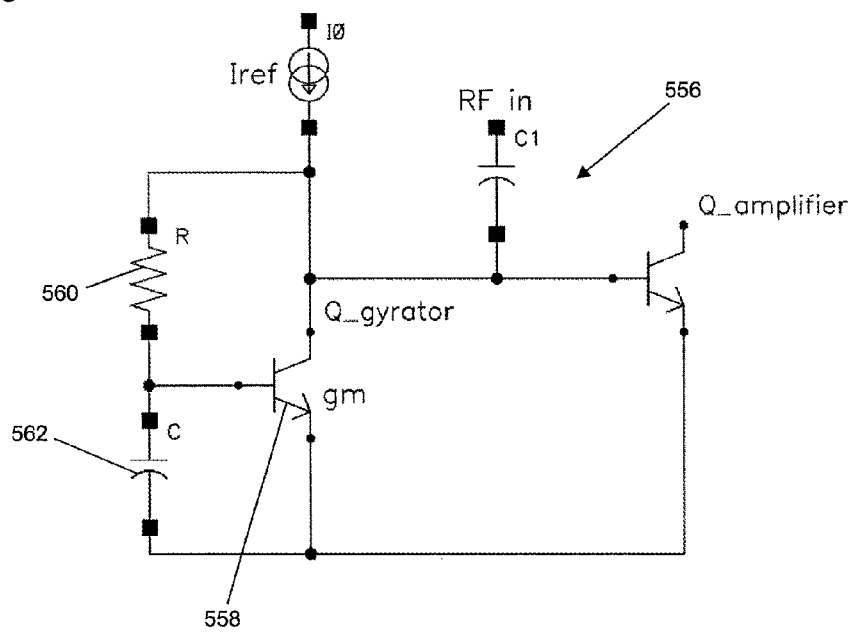
FIG. 5 shows a capacitively loaded gyrator that can provide low-ohmic biasing for a driver.

FIG. 5 shows a capacitively loaded gyrator 556 that can provide low-ohmic biasing for a driver. The gyrator is implemented by means of a transistor 558 and a resistor R 560 between its base and collector. A capacitive load C 562 is between the base and emitter of the gyrator-transistor 558 (with a transconductance represented by $g_m$). This capacitively loaded gyrator presents a one-port, which behaves as a series connection of a voltage source ($V_{be}$), an inductance $L_{eq}$=RC/$g_m$, and a small resistance 1/$g_m$. The equivalent inductance value $L_{eq}$ is chosen such that it has a high impedance for RF and a low impedance for the modulation frequencies to avoid memory effects. The small resistance 1/$g_m$ can prevent or reduce problems which could be caused by avalanche of the amplifier-transistor. Fortunately this resistance 1/$g_m$ gets smaller for larger avalanche currents and therefore can provide good protection.

Bias current control can be implemented individually for all amplifier, driver and pre-driver stages, in both the main and peaking path of a Doherty amplifier.

Driver: Inter-Stage Matching Between Pre-Driver and Driver

Figure 6:
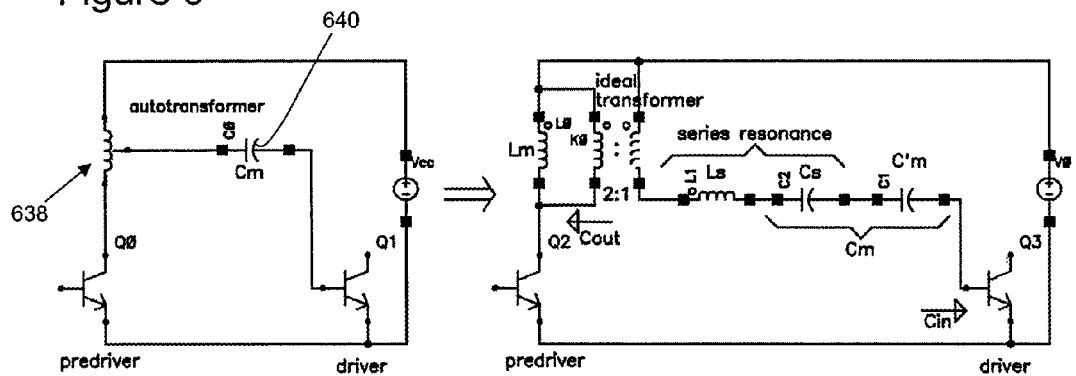
FIG. 6 shows schematically an analysis of an inter-stage-matching network between a pre-driver and a driver.

FIG. 6 shows schematically an analysis of an inter-stage-matching network between a pre-driver and a driver.

The inter-stage-matching network consists of an auto-transformer 638 (coil with tap, such as a centre tap) in the pre-driver's collector lead, and a series matching capacitor Cm 640, as shown on the left-hand side of FIG. 6.

Although the autotransformer tap does not necessarily need to be in the centre, in the following piece of text it has been assumed that the tap is exactly in the centre.

For the purpose of analysis, the autotransformer on the left-hand side of FIG. 6 is replaced by an ideal transformer (2:1) together with magnetization inductance $L_m$ and leakage inductance $L_s$, as shown on the right-hand side. Also, the matching capacitor $C_m$ on the left-hand side is replaced by a series connection of capacitances $C_s$ and $C'_m$, as shown on the right-hand side.

The impedance of the leakage inductance $L_s$ at the output (centre tap) of the autotransformer cancels with a part (corresponding with $C_s$) of the impedance of $C_m$. Let's represent the corresponding capacitance of the remaining part of the impedance of $C_m$ with $C'_m$. This $C'_m$ together with the collector-base capacitance $C_{bc}$ of the driver defines the voltage gain of the driver: $Av=-C'_m/C_{bc}$ in case of large loop gain. Since the autotransformer introduces a voltage division of a factor of 2, the magnitude of the driver's voltage gain $|A_v|$ should be larger than 2 if the driver's collector voltage should clip before the pre-driver's collector voltage clips, in case of increasing signal amplitude. However, an unnecessary large voltage gain is not desired since this decreases the pre-driver's efficiency and increases the amplitude of the signal current that should be delivered by the pre-driver. Therefore a voltage-gain magnitude $|A_v|$ of about 3 is a good choice for some applications. This consideration determines the value of matching capacitor $C_m$. The capacitance seen on the collector of the pre-driver is the series connection of $C'_m$ and the input capacitance $C_{in}$ of the driver divided by 4 due to the impedance transformation of the autotransformer: $(C'_m//C_{in})/4$ where the symbol // represents series connection of capacitances. In parallel with that capacitance $(C'_m//C_{in})/4$ is the output capacitance $C_{out}$ of the pre-driver. The sum of these two capacitances, $C_{out}+[(C'_m//C_{in})/4]$, is to be tuned out by the magnetisation inductance $L_m$ of the autotransformer.

PA Pre-Driver Design

Figure 7:
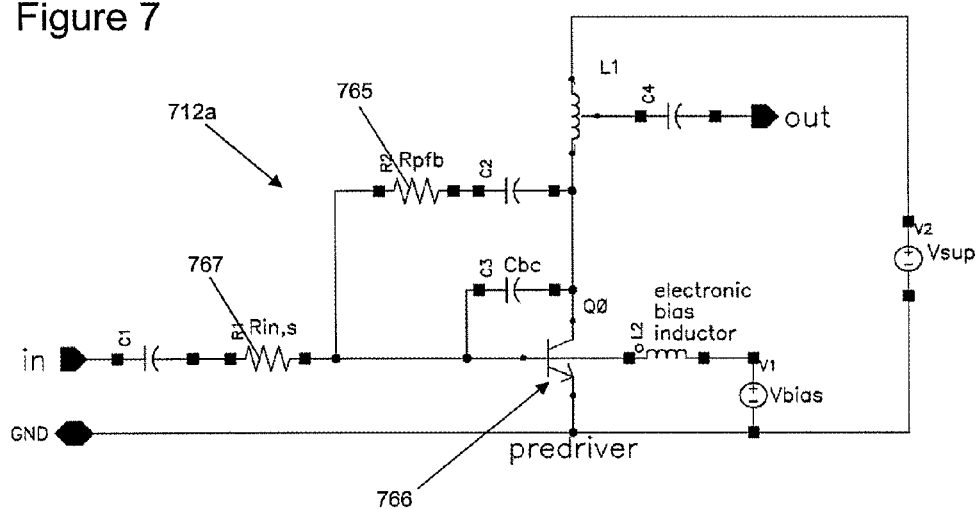
FIG. 7 shows a simplified schematic of a pre-driver.

FIG. 7 shows a simplified schematic of a pre-driver 712a.

For the output stage and driver, the voltage gain is mainly determined by a capacitance ratio: $A_v \approx -C'_m/C_{bc}$ where $C'_m$ represents the effective capacitance of the series matching capacitor $C_m$ taking into account the effect of the series leakage inductance. However, in case of the pre-driver, as shown in FIG. 7, the voltage gain is mainly determined by a resistance ratio: $A_v \approx R_{pfb}/R_{in,s}$ where $R_{pfb}$ 765 represents the parallel-feedback resistor and $R_{in,s}$ 767 represents the resistor in series with the pre-driver's input, which also serves as input matching.

Pre-Driver: Input Resistance of Main- and Peaking Pre-Driver

Both the main- and peaking-pre-driver have an input resistance of 100Ω in this example. The programmable attenuator, which is in front of the peaking chain as shown in FIGS. 1 and 2, is designed such that its input resistance is 100Ω irrespective of its programmed setting. However it expects a load resistance of 100Ω. The characteristic impedance of the lumped-element phase shifter (also shown in FIGS. 1 and 2) is 100Ω so a load resistance of 100Ω (input resistance of peaking pre-driver) translates into an input resistance of 100Ω (load resistance for attenuator). Since the inputs of the main- and peaking-branch are connected in parallel, an overall input resistance of (100//100)=50Ω is obtained. In order to accurately obtain a pre-driver's input resistance of 100 Ω, 80% of this input resistance is implemented in a passive way and only 20% in an active way in this implementation. This means a series resistor of 80Ω together with a non-perfect virtual ground of 20Ω. Assuming a current division around the output of a factor of 2 (only 50% of the collector signal current is fed back and the rest goes to the next stage), a transconductance $g_m$ of 2/(20Ω) =0.1 A/V is required. At 60° C., $V_T$ equals 29 mV, and so this requires a collector bias current of $g_m*V_T$=3 mA.

Pre-Driver: Biasing

Like the driver, the pre-driver is low-ohmicly biased by a capacitively loaded gyrator. Details of such a gyrator are provided above under the heading "Driver: Biasing".

Adjustable Input Power Splitter

Figure 8:
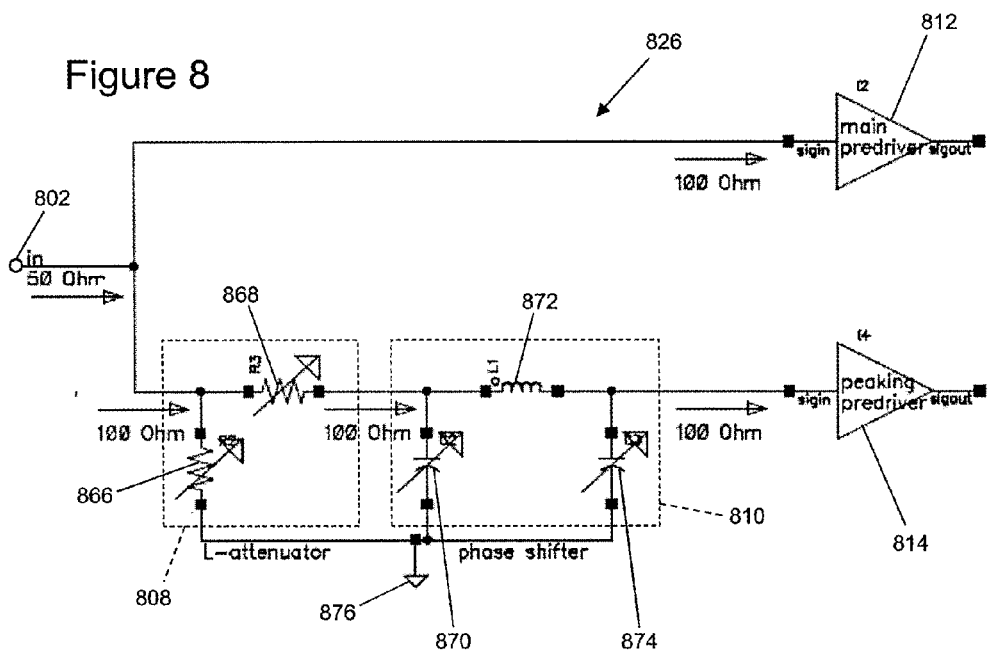
FIG. 8 shows an example configuration of a splitter circuit.

FIG. 8 shows an example configuration of a splitter circuit 826.

As discussed above with reference to FIGS. 1 and 2, the splitter 826, which may also be referred to as an input power splitter, splits an input signal for the main and peaking path. Because the signal in the main path travels through an impedance inverter with 90 degrees phase shift, the signal in the peaking path also needs 90 degrees phase shift. This phase shift in the peaking path is implemented in the input power splitter. Both phase and amplitude in the peaking path of the splitter can be adjusted for optimal performance of the Doherty PA. This programmability of the amplitude controller (implemented as an attenuator 808) and phase controller 810 in the peaking path can be used to operate under different but optimal settings for different frequencies, different temperatures, different supply voltages and even different products as a result of process spread.

In FIG. 8, a splitter-attenuator 808 and a splitter-phase-shifter 810 are connected in cascade with each other between a Doherty-input-terminal 802 and a peaking-power-input-terminal of a peaking-power-amplifier 814. The splitter-attenuator 808 is configurable to apply a variable attenuation factor or amplification factor to the input signal before it is processed by the peaking-power-amplifier 814. The splitter-phase-shifter 810 is configurable to apply a variable phase shift to the input signal before it is processed by the peaking-power-amplifier 814. It will be appreciated that the order of these components 808 and 810 might be reversed.

In particular, the values of the variable splitter-attenuator 808 and/or the variable splitter-phase-shifter 810 can be set to reduce the likelihood of the operation of the Doherty amplifier becoming unstable when the temperature of the circuit changes. For example, a controller (not shown) can receive one or more sensed-temperature-signals representative of a temperature of part of the circuit. For example, sensed-temperature-signals can be received that are representative of: a temperature of the IC, or a temperature of the main- or peaking-power-amplifier of the Doherty amplifier. The controller can then set control parameters of one or more variable components within the variable splitter-attenuator 808 and/or the variable splitter-phase-shifter 810 based on the sensed-temperature-signals. For example, if the control is digitally implemented, then if the sensed-temperature-signals passes a certain temperature threshold, the controller can cause an extra unit capacitor to be added to a CLC implementation of the splitter-phase-shifter 810 and/or can cause a unit shunt resistor to be removed from the variable splitter-attenuator 808. Such adding and removing can be implemented by means of MOSFET switches, for example.

In one example, the controller can receive sensed-temperature-signals over a serial interface. The controller can also receive an operational-signal that is used to set whether or not the controller applies an on-chip calibration loop. If the on-chip calibration loop is to be applied, then the controller can use a look-up-table (LUT) to determine appropriate control parameters for the variable splitter-attenuator 808 and/or the variable splitter-phase-shifter 810 based on the received sensed-temperature-signals. The information in the LUT can be hard-coded, or can be programmable and stored in OTP (one-time programmable) memory, for example. The use of OTP memory can be beneficial because, for each product, its performance can be measured in a factory, and then control parameters appropriate for the measured performance can be stored in the OTP memory for future use.

In another example, the controller can apply an algorithm to the received sensed-temperature-signals in order to determine control parameters that are to be applied to the variable splitter-attenuator 808 and/or the variable splitter-phase-shifter 810.

The splitter-attenuator 808 includes a first-variable-resistor 866 and a second-variable-resistor 868. The second-variable-resistor 868 is connected between an attenuator-input-terminal and an attenuator-output-terminal. The first-variable-resistor 866 is connected between the attenuator-input-terminal and a reference-terminal 876. The values of the first-variable-resistor 866 and/or the second-variable-resistor 868 can be set/adjusted in order to provide a desired attenuation factor, and therefore control the magnitude of the signal that is provided to the peaking-power-amplifier 814.

The splitter-phase-shifter 810 is implemented as a CLC circuit in this example, and includes a first-variable-capacitor 870, an inductor 872 and a second-variable-capacitor 874. The first-variable-capacitor 870 is connected between a phase-shifter-input-terminal and the reference-terminal 876. The inductor 872 is connected between the phase-shifter-input-terminal and a phase-shifter-output-terminal. The second-variable-capacitor 874 is connected between the phase-shifter-output-terminal and the reference-terminal 876. The values of the first-variable-capacitor 870 and/or the second-variable-capacitor 874 can be set/adjusted in order to provide a desired amount of phase shift. In this way, the phase of the signal that is provided to the peaking-power-amplifier 814 can be controlled.

In one example, the variable components (the variable resistors 866, 868 and the variable capacitors 870, 874) can be implemented digitally by using (n-type) MOSFETs as RF switches. For instance, an L-type Digital Step Attenuator (DSA) can be used.

Figure 9A:
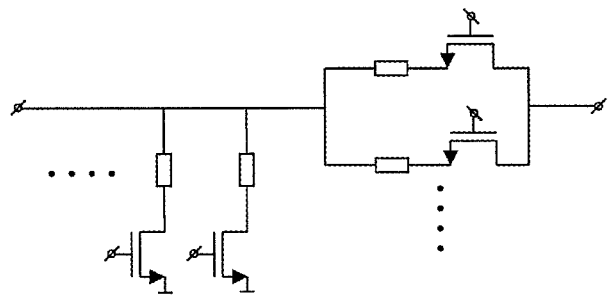
FIGS. 9a to 9c show various implementations of circuits that can be used to provide the functionality of a variable component that is disclosed herein.
Figure 9B:
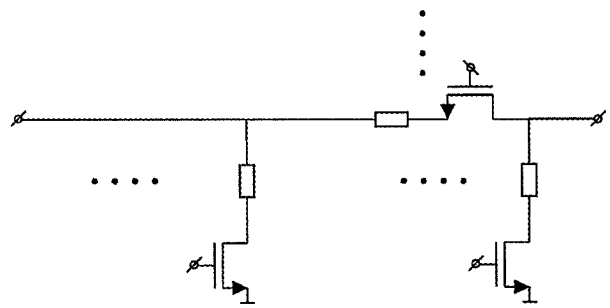
Figure 9C:
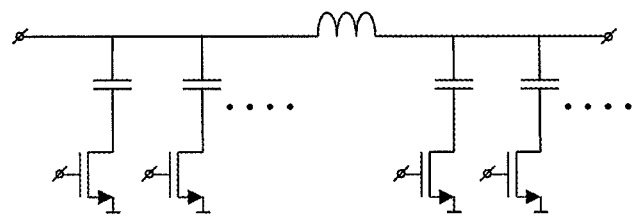

FIGS. 9a to 9c show various implementations of circuits that can be used to provide the functionality of a variable component that is disclosed herein.

FIG. 9a shows an example of an L-type DSA (digital step attenuator) (for example with NMOST devices). It will be appreciated that multiple sections of a series connection of a resistor and an NMOSFET switch can be placed in parallel for both the shunt and series branch. The amount of parallelism may be chosen based on the amount of resolution, that is, the amount of bits that are considered appropriate for proper control. Additionally, the amount of parallelism can be designed based on preferred coding, for example binary coding where the amount of parallel branches equals the amount of bits, or thermometer coding where the amount of parallel branches equals 2 to the power of (amount of bits). An advantage of thermometer coding is that monotonicity is guaranteed which is beneficial for stability when the splitter-attenuator is part of a control loop.

FIG. 9b shows an example of a PI-type (π-type) DSAs can be used. The PI-type DSA can include a shunt-R-series-R-shunt-R connection. In one example, the DSA can have 8 states (and therefore is 3 bit) and can have a step size of 0.5 dB.

FIG. 9c shows an example of a digitally adjustable phase shifter. Again, for example with NMOST devices. It will be appreciated that multiple sections of a series connection of a capacitor and an NMOSFET switch can be placed in parallel.

Generally, various resistors, capacitors and switches can be used as unit devices having equal values, or can have different values.

Returning to FIG. 8, the splitter-phase-shifter 810 of FIG. 8 comprises of a CLC topology with switchable parallel C branches. This topology can also be implemented digitally. However, for applications that use larger bandwidths (400 MHz at 2 GHz), a CLC topology can have performance limitations.

Figure 10:
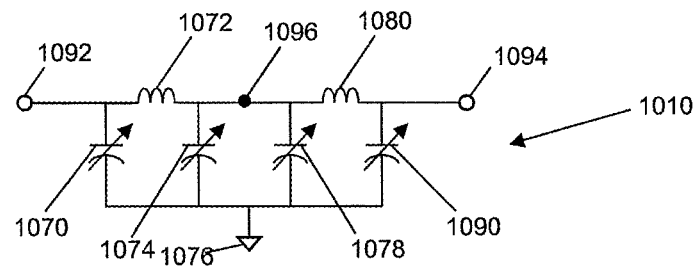
FIG. 10 shows an alternative implementation of a splitter-phase-shifter.

FIG. 10 shows an alternative implementation of a splitter-phase-shifter 910, which is provided as a CLCCLC topology, where each CLC circuit shifts the phase by 45 degrees.

The splitter-phase-shifter 1010 includes a first-variable-capacitor 1070, a first-inductor 1072, a second-variable-capacitor 1074, a third-variable-capacitor 1078, a second-inductor 1080 and a fourth-variable-capacitor 1090. The first-variable-capacitor 1070 is connected between a phase-shifter-input-terminal 1092 and a reference-terminal 1076. The first-inductor 1072 is connected between the phase-shifter-input-terminal 1092 and an intermediate-node 1096. The second-variable-capacitor 1074 is connected between the intermediate-node 1096 and the reference-terminal 1076. The third-variable-capacitor 1078 is connected between the intermediate-node 1096 and the reference-terminal 1076. The second-inductor 1080 is connected between the intermediate-node 1096 and a phase-shifter-output-terminal 1094. The fourth-variable-capacitor 1090 is connected between the phase-shifter-output-terminal 1094 and the reference-terminal 1076.

The splitter-phase-shifter 1010 can provide the following advantages. It can be less sensitive for process spread than the single-CLC topology. Also, it can be less frequency dependent and can lead to a more orthogonal amplitude/phase control compared to the single-CLC topology. Also, good return losses can be achieved. For example, return losses of >15 dB over a wider frequency range, i.e. bandwidth, can be provided. Alternatively, for a given bandwidth, the circuit can maintain better return loss >15 dB over a wider phase control range. Therefore, the splitter-phase-shifter 1010 can provide bandwidth and range benefits.

One or more of the examples disclosed herein can be considered as a fully integrated Doherty amplifier, in which an input power splitter, a main amplifier, a peaking amplifier, and part of an output power combiner are monolithically integrated. The other part of the output power combiner can be integrated on a laminate. The chip and laminate together reside within the same package. The input power splitter can contain a digitally controlled phase shifter and attenuator. By controlling the attenuator and phase shifter, the overall linearity of the Doherty amplifier can be optimized. The Doherty amplifier has an efficiency which is considerably larger than that of a class-AB amplifier, when amplifying signals which have a large peak-to-average power ratio like radio signals used in cellular communication systems and wireless local area networks.

Examples disclosed herein can add value in terms of increased integration levels, including those examples that include a digital bus (e.g. SPI, I2C, MIPI) for example to implement adjustable-splitter control (amplitude and phase), bias-current control and system-readout possibilities (e.g. power level, temperature, over-voltage, under-voltage, over-current, over-temperature).

There can be advantages to providing the peaking-power-amplifier as a class C amplifier, and making the class C threshold in the peaking path programmable, since this determines the take-over point where the peaking amplifier starts helping the main amplifier to deliver power to the load. The class C threshold can be programmed based on the operating frequency, temperature, load impedance or supply voltage, for example. It can also be programmed based on the specific process spread that a product realization of the Doherty amplifier circuit has experienced. Hence, programming this peaking amplifier threshold can be part of the calibration or self-calibration of the Doherty amplifier circuit.

One or more of the circuits disclosed herein can address the following problems: low-efficiency operation when amplifying signals having a high peak-to-average-power-ratio, narrow-band signal transfer, nonlinear signal amplification, low signal gain, and a bulky implementation.

When an ordinary single-chain class-AB amplifier would be used to amplify a signal having a high peak- to average-power ratio, then the average power level of the signal should be adjusted such that there would be enough headroom to be able to amplify the large signal peaks without introducing significant distortion. In other words: such a single-chain amplifier should be operated in back-off mode. This can yield a low efficiency.

Examples disclosed herein contain two amplifier chains, instead of only one: which can be a main amplifier (class AB) and a peaking amplifier (class C). In this case, because the main amplifier is load-modulated by the peaking amplifier, there may be no need to operate the main amplifier in back-off mode since the signal peaks are handled by the peaking amplifier. This can yield a high efficiency.

In examples disclosed herein, the signals generated by the main- and peaking amplifiers are combined by an output power combiner which introduces impedance inversion in the main path and impedance transformation in the peaking path. This impedance inversion and impedance transformation can be designed in order to obtain a large signal-transfer bandwidth.

In examples disclosed herein the input signal is split by means of an adjustable input power splitter into a first signal driving the main amplifier and a second signal driving the peaking amplifier. This input power splitter introduces signal attenuation and phase shifting in the peaking path. The amount of signal attenuation as well as phase shifting can be adjusted such as to optimize the overall linearity of the Doherty amplifier.

In examples disclosed herein both the main- and peaking amplifier chain are equipped with multiple gain stages. This can yield a nearly signal-strength independent loading on the input power splitter and it can provide a large amount of power gain which is beneficial for the power-added efficiency and can be convenient for the end user.

The instructions and/or flowchart steps in the above figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. A Doherty amplifier circuit comprising:
   a splitter having:
      a splitter-input-terminal for receiving an input signal;
      a main-splitter-output-terminal; and
      a peaking-splitter-output-terminal;
   a main-power-amplifier having a main-power-input-terminal and a main-power-output-terminal, wherein:
      the main-power-input-terminal is connected to the main-splitter-output-terminal; and
      the main-power-output-terminal is configured to provide a main-power-amplifier-output-signal;
   a peaking-power-amplifier having a peaking-power-input-terminal and a peaking-power-output-terminal, wherein:
      the peaking-power-input-terminal is connected to the peaking-splitter-output-terminal; and
      the peaking-power-output-terminal is configured to provide a peaking-power-amplifier-output-signal;
   an integrated circuit;
   wherein the splitter, the main-power-amplifier and the peaking-power-amplifier are provided by means of the integrated circuit;
   wherein the splitter-input-terminal is connected to the main-splitter-output-terminal, and;
   wherein the splitter comprises a splitter-attenuator and a splitter-phase-shifter connected in cascade between the splitter-input-terminal and the peaking-splitter-output-terminal.

2. The Doherty amplifier circuit of claim 1, wherein the splitter-attenuator and the splitter-phase-shifter are provided on the integrated circuit.

3. The Doherty amplifier circuit of claim 1, wherein the splitter-attenuator comprises a variable splitter-attenuator that is configurable to apply a variable attenuation or amplification factor to the input signal.

4. The Doherty amplifier circuit of claim 3, wherein the variable splitter-attenuator comprises:
a first-variable-resistor; and
a second-variable-resistor
wherein:
the second-variable-resistor is connected between an attenuator-input-terminal and an attenuator-output-terminal; and
the first-variable-resistor is connected between the attenuator-input-terminal and a reference-terminal.

5. The Doherty amplifier circuit of claim 1, wherein the splitter-phase-shifter comprises a variable splitter-phase-shifter that is configurable to apply a variable phase shift to the input signal.

6. The Doherty amplifier circuit of claim 5, wherein the variable splitter-phase-shifter comprises:
a first-variable-capacitor,
a first-inductor,
a second-variable-capacitor,
a third-variable-capacitor,
a second-inductor, and
a fourth-variable-capacitor;
wherein:
the first-variable-capacitor is connected between a phase-shifter-input-terminal and a reference-terminal;
the first-inductor is connected between the phase-shifter-input-terminal and an intermediate-node;
the second-variable-capacitor is connected between the intermediate-node and the reference-terminal;
the third-variable-capacitor is connected between the intermediate-node and the reference-terminal;
the second-inductor is connected between the intermediate-node and a phase-shifter-output-terminal; and
the fourth-variable-capacitor is connected between the phase-shifter-output-terminal and the reference-terminal.

7. The Doherty amplifier circuit of claim 1, further comprising a controller that is configured to:
receive one or more sensed-temperature-signals; and
set control parameters of the variable splitter-attenuator and/or the variable splitter-phase-shifter based on the sensed-temperature-signals.

8. The Doherty amplifier circuit of claim 7, wherein the sensed-temperature-signals are representative of: a temperature of the integrated circuit, or a temperature of the main-power-amplifier or the peaking-power-amplifier.

9. The Doherty amplifier circuit of claim 1, further comprising:
a transformer having a transformer-input-terminal and a transformer-output-terminal, wherein:
the transformer-input-terminal is connected to the peaking-power-output-terminal; and
the transformer-output-terminal is configured to provide a transformer-output-signal to a combining node.

10. The Doherty amplifier circuit of claim 9, wherein the transformer is provided on the integrated circuit.

11. The Doherty amplifier circuit of claim 1, further comprising:
a package; and
a laminate;
wherein the integrated circuit and the laminate are provided in the package.

12. The Doherty amplifier circuit of claim 11, further comprising a main-output-impedance-inverter connected between the main-power-output-terminal and a combining node, wherein the main-output-impedance-inverter comprises a CLC-inductor, a first-CLC-capacitor and a second-CLC-capacitor, wherein:
the CLC-inductor is connected between the main-power-output-terminal and the combining node;
the first-CLC-capacitor is connected between the main-power-output-terminal and a reference terminal; and
the second-CLC-capacitor is connected between the combining node and the reference terminal.

13. The Doherty amplifier circuit of claim 12, wherein the first-CLC-capacitor is provided on the integrated circuit, and wherein the CLC-inductor and the second-CLC-capacitor are provided on the laminate.

14. The Doherty amplifier circuit of claim 1, wherein the integrated circuit comprises a BiCMOS circuit.

15. A Doherty amplifier circuit comprising:
a splitter having:
a splitter-input-terminal for receiving an input signal;
a main-splitter-output-terminal; and
a peaking-splitter-output-terminal;
a main-power-amplifier having a main-power-input-terminal and a main-power-output-terminal, wherein:
the main-power-input-terminal is connected to the main-splitter-output-terminal; and
the main-power-output-terminal is configured to provide a main-power-amplifier-output-signal;
a peaking-power-amplifier having a peaking-power-input-terminal and a peaking-power-output-terminal, wherein:
the peaking-power-input-terminal is connected to the peaking-splitter-output-terminal; and
the peaking-power-output-terminal is configured to provide a peaking-power-amplifier-output-signal;
an integrated circuit;
wherein the splitter, the main-power-amplifier and the peaking-power-amplifier are provided by means of the integrated circuit; and
a controller that is configured to,
receive one or more sensed-temperature-signals; and
set control parameters of the variable splitter-attenuator and/or the variable splitter-phase-shifter based on the sensed-temperature-signals.

16. A Doherty amplifier circuit comprising:
a splitter having:
a splitter-input-terminal for receiving an input signal;
a main-splitter-output-terminal; and
a peaking-splitter-output-terminal;
a main-power-amplifier having a main-power-input-terminal and a main-power-output-terminal, wherein:
the main-power-input-terminal is connected to the main-splitter-output-terminal; and
the main-power-output-terminal is configured to provide a main-power-amplifier-output-signal;
a peaking-power-amplifier having a peaking-power-input-terminal and a peaking-power-output-terminal, wherein:
the peaking-power-input-terminal is connected to the peaking-splitter-output-terminal; and
the peaking-power-output-terminal is configured to provide a peaking-power-amplifier-output-signal;
an integrated circuit;

wherein the splitter, the main-power-amplifier and the peaking-power-amplifier are provided by means of the integrated circuit;
a package;
a laminate;
wherein the integrated circuit and the laminate are provided in the package;
a main-output-impedance-inverter connected between the main-power-output-terminal and a combining node, wherein,
　　the main-output-impedance-inverter comprises a CLC-inductor, a first-CLC-capacitor and a second-CLC-capacitor,
　　the CLC-inductor is connected between the main-power-output-terminal and the combining node;
　　the first-CLC-capacitor is connected between the main-power-output-terminal and a reference terminal; and
　　the second-CLC-capacitor is connected between the combining node and the reference terminal.

* * * * *